United States Patent
Xiao

(10) Patent No.: US 8,496,993 B2
(45) Date of Patent: Jul. 30, 2013

(54) NANOCOMPOSITE COATINGS ON CEMENTED CARBIDE

(75) Inventor: Xingcheng Xiao, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 547 days.

(21) Appl. No.: 12/472,431

(22) Filed: May 27, 2009

(65) Prior Publication Data
US 2010/0303564 A1 Dec. 2, 2010

(51) Int. Cl.
*C23C 16/00* (2006.01)
(52) U.S. Cl.
USPC ............... 427/249.8; 427/249.1; 423/447.3; 977/742
(58) Field of Classification Search
USPC ................ 427/248.7, 248.8, 248.13
See application file for complete search history.

(56) References Cited

U.S. PATENT DOCUMENTS

| 6,420,293 B1 * | 7/2002 | Chang et al. | 501/95.2 |
| 2006/0222850 A1 * | 10/2006 | Xiao et al. | 428/408 |

OTHER PUBLICATIONS

Vojs (Diamond & Related Materials 14(2005) 613-616).*
Yang (Carbon 46 (2008) 589-595, available Jan. 16, 2008).*
Q. Yang et al.; Selective growth of diamond and carbon nanostructures by hot filament chemical vapor deposition; Elsevier; Diamond and Related Materials 13 (2004) pp. 433-437; Plasma Physics Laboratory; Canada.

* cited by examiner

*Primary Examiner* — Michael Cleveland
*Assistant Examiner* — Joel Horning
(74) *Attorney, Agent, or Firm* — Reising Ethington P.C.

(57) ABSTRACT

A method of creating adherent, fracture-toughened polycrystalline diamond coatings on carbide cutting tools or other workpiece substrates through the development of composite coatings comprising polycrystalline diamond and carbon nanotubes is described. The coating is deposited through a chemical vapor deposition process using a pre-determined hydrocarbon-hydrogen gas mixture suitable for nucleating diamond on the carbide particles and carbon nanotubes on the metallic binder. The deposited coating, which may be up to 30 micrometers in thickness, is typically characterized by a diamond or diamond-like carbon matrix in which carbon nanotubes are distributed as fiber-like filler materials.

9 Claims, 2 Drawing Sheets

NANOCOMPOSITE COATINGS ON CEMENTED CARBIDE

TECHNICAL FIELD

This invention relates to methods of depositing polycrystalline diamond coatings reinforced with carbon nanotubes on sintered carbide articles. The invention has particular application to cutting surfaces of sintered carbide cutting tools to promote superior adhesion of a diamond coating and to improve its resistance to fracture and chipping.

BACKGROUND OF THE INVENTION

Cutting tools are used to remove metal as chips from a metal workpiece. Such tools have evolved into many specialized shapes but universally comprise a cutting edge which is urged into moving contact with the workpiece for removal of metal in shaping the workpiece. In the automobile industry, for example, cast silicon-containing aluminum alloys are used to form engine blocks and metal is cut from the cast surfaces, using cutting tools such as drills, boring bars and face mills, to give shape to the engine block.

Tool cutting edges are subjected to high loading and high temperatures as well as mechanical and thermal shock. This difficult environment leads to degradation of the cutting edge due to either wear or fracture. When the edge degradation reaches unacceptable levels the cutting process must be interrupted and the tool must be replaced or re-sharpened, which has prompted continuing investigations into new or improved cutting tool materials in an effort to prolong useful tool life. Currently, carbide tools generally comprising hard particles of tungsten carbide held in a metal matrix, usually cobalt, are the preferred tools for general purpose metal machining. Sometimes nickel and/or chromium are used in the metal matrix binder. The metal matrix typically makes up about five to ten percent by volume of the tungsten carbide plus matrix volume. Carbide particles sizes often range from about 1.5 to about ten micrometers in largest dimension (sometimes classified as from fine to medium).

However carbide tools are challenged by machining the aluminum-silicon engine alloys used by the automobile industry since the hard silicon particles in the alloy promote rapid tool wear. One approach to reducing the wear rate is to apply a hard, wear-resistant surface coating to the carbide tool, and for this application, diamond coatings have been preferred. Diamond however is a ceramic and therefore intrinsically brittle and prone to chipping. Also, achieving good adhesion between the diamond coating and the carbide tool can be difficult. Thus there is a need for a process to deposit an improved, adherent, tough diamond or diamond-containing coating on carbide tools.

SUMMARY OF THE INVENTION

This invention provides a composite, randomly-aligned carbon nanotube-filled, polycrystalline diamond coating on metal carbide particle-metal matrix substrates. The reinforced polycrystalline diamond coating layer displays improved durability and adherence to such bonded carbide substrates. This reinforced diamond coating has particular utility on cutting tools, especially cutting surfaces for such tools, and may reduce the need for a machining coolant or lubricant. But, it is recognized that such carbon nanotube-filled diamond coatings add value to other metal-bonded, metal carbide particle articles.

One embodiment of the invention is in the method of forming a randomly-aligned carbon nanotubes-containing polycrystalline diamond or diamond-like coating on a metal-bonded tungsten carbide substrate. Cobalt is often used as the bonding matrix material. However, in some embodiments, nickel or chromium may be used as the bonding material, and mixtures of two or more of chromium, cobalt, and nickel have been used. These tools are prepared by generally-conventional powder processing techniques involving powder pressing of the carbide and the binder followed by sintering of the powder compact.

In practices of this invention, such a carbide workpiece is prepared so that a surface of a metal-bonded tungsten carbide substrate is suitably clean and has a suitable texture for the co-deposition of a diamond material and carbon nanotubes onto the substrate. The co-deposition is made from a gas mixture which consists essentially of predetermined suitable proportions of hydrogen and a hydrocarbon such as methane or acetylene. The substrate region will generally encompass substantially the whole tool surface but, through appropriate masking, it may be restricted to only a selected region such as a cutting edge of the tool. The substrate region to be treated is prepared so that both metal matrix surfaces and metal carbide particle surfaces are clean and accessible to a contacting gas mixture for the deposition. Such surfaces may be abraded to increase surface area and/or reduced with hydrogen before the film deposition process is started.

For example, in a cobalt-bonded, tungsten carbide particle substrate both material phases are contacted by the hydrogen and hydrocarbon mixture at predetermined suitable temperature range and pressure range. This practice is an embodiment of a chemical vapor deposition (CVD) process. The deposition of the carbon may be facilitated by activating the gas with, for example, microwave radiation or hot filaments near the substrate surface. But the deposition process is managed so that carbon is deposited both as polycrystalline diamond (with $sp^3$ carbon-carbon bonding or a mixture of $sp^3$ with some $sp^2$ carbon-carbon bonding) and randomly-aligned carbon nanotubes. The proportion of hydrogen and specific hydrocarbon specie or species is pre-determined and controlled to co-deposit a coating characterized by a polycrystalline diamond matrix phase containing dispersed carbon nanotubes over a deposition period. The relatively long nanotubes (compared to their diameters) serve as reinforcing fiber-like fillers in the diamond matrix, strengthening it and improving its adherence to the carbide substrate.

In many embodiments of the co-deposition it is found that carbon nanotubes initially nucleate and deposit with random orientation on cobalt surfaces and the polycrystalline diamond clusters nucleate, at multiple nucleation sites, and form on tungsten carbide surfaces. With continued co-deposition from a predetermined mixture of, for example, about ten percent by volume of methane and ninety percent by volume hydrogen, the composite film is formed over the carbide substrate surface to a desired thickness of, for example, up to about 30 micrometers.

Thus, the inventor has made the unexpected and surprising discovery that through optimal surface preparation of the tool substrate and control of the carbon deposition process, particularly the gas composition and temperature, it is possible to co-deposit carbon nanotubes with multiple orientations and polycrystalline diamond, while simultaneously suppressing graphite formation. Specifically the inventor has discovered that carbon nanotubes may be nucleated on the metallic binder phase of carbide tools and that diamond may be nucleated on the carbide phase.

Although nucleated on or originating from different regions of the carbide tool, continued deposition of carbon in the CVD-type process is practiced to cause continued growth of the diamond layer and of the carbon nanotubes. The chemical compatibility of the carbon-based diamond and the carbon-based nanotubes will lead to their intergrowth and the development of a fiber-reinforced diamond composite.

Another embodiment of the invention is the coated substrate with its more adherent and durable carbon nanotube-reinforced diamond coating layer. As stated above, the deposited diamond (or diamond-like) matrix covers a desired region of a composite carbide substrate and the matrix is reinforced with fiber-like carbon nanotubes.

Other objects and advantages of the invention will become more apparent from a description of exemplary preferred embodiments which follow.

BRIEF DESCRIPTION OF THE DRAWINGS

FIG. 2 illustrates a predetermined range of temperatures and gas compositions where both diamond and carbon nanotubes may form on the cobalt/tungsten carbide substrate.

FIG. 3A illustrates the nucleation of diamond on the carbide particles and the nucleation of carbon nanotubes on the metallic binder at an early stage in the process. For convenience a single deposit is shown on each carbide particle, but multiple nucleation sites may exist and even on a single carbide particle multiple diamond nuclei may promote diamond formation. FIG. 3B illustrates a later stage in the process when lateral growth of the individual diamond nuclei and continued growth of the carbon nanotubes has resulted in intergrowth of the two deposits and the formation of a polycrystalline diamond layer.

DESCRIPTION OF PREFERRED EMBODIMENTS

Figure 1:
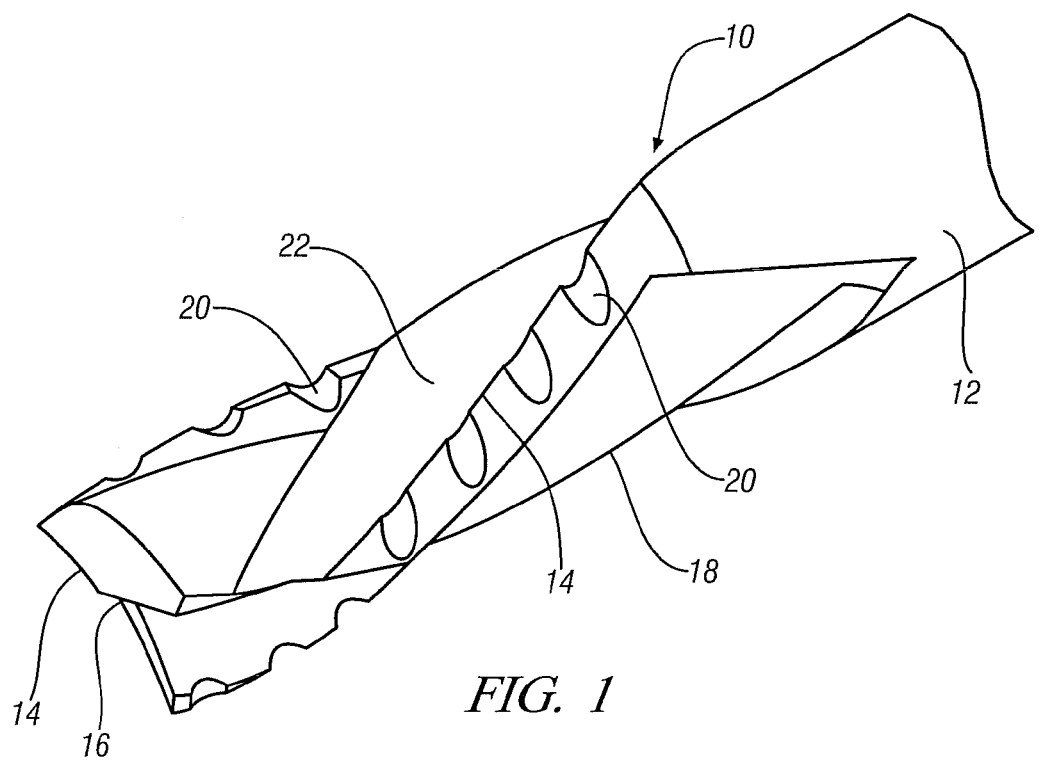
FIG. 1 shows an example of a carbide cutting tool, an end mill, suitable for the practice of this invention to illustrate the complex workpiece and substrate geometries which may be treated by this invention.

The practice of this invention has been discussed in the context of its utility for one application of bonded carbide cutting tools, one example of which is shown in FIG. 1. This tool 10 is secured to a chuck or collet in a milling machine using shank 12 and has multiple, helical shaped cutting edges 14 formed about its circumference, not all of which are visible or labeled, both on its underside 16 and along the length of the tool 18. This tool is intended for rapid metal removal, 'roughing', and has chip splitting features 20 on the cutting edges 14 which extend along the length of the tool 18. These chip splitters 20 are intended to fragment the chip into smaller more manageable metal fragments. Helical grooves 22, 'flutes' run from tool underside 16 to almost shank 12 and serve to transport and discharge the machining chips. With the exception of the shank 12, the cited elements of this tool are subject to one or more of: significant loads due to metal cutting; elevated temperatures; and abrasion due to the transit of metal chips during process of their removal or due to rubbing of the tool on the machined surface. Thus all the features described will benefit from diamond deposition, necessitating a deposition process capable of depositing diamond over this complex tool geometry.

The hardness and wear resistance of bonded carbide however render it suitable for a variety of applications including: bushings, including drill bushings; seal rings; nozzles; dies; guides, rollers and wear strips; punches and pins. This invention is broadly directed towards a means of developing improved diamond coatings on carbide and thus any article fabricated from carbide may act as a substrate for deposition of diamond and thereby benefit from this invention. Thus discussion of its application to cutting tools is intended as exemplary and not limiting.

Further, although the generic term carbide has been used, carbide is available in a wide range of formulations. By way of example only, and with particular application to cutting tools, these formulations differ in:

The quantity of the metallic binder phase. A preferred range of binder constituent for the carbide particles is 5.5% by weight (employed, for example in ISO—International Standards Organization—grades K01 and P15) to 11% by weight (employed, for example, in ISO grades K30 and P45).

The nature of the metallic binder phase. Typically this is cobalt, as for example in the ISO K and P grades mentioned previously, but nickel and chromium are also used, though far less frequently.

The nature of the hard particle. Typically this is tungsten carbide but micro-grain grades incorporating vanadium or chromium carbide in quantities in the tenths of a percent range, and alloyed grades incorporating titanium carbide, tantalum carbide and niobium carbide in the several percent ranges are also available.

The size of the hard particle. For cutting tool applications the sharpness of the tool edge depends on the hard particle size. Thus, tools intended for roughing cuts will typically have coarser particles than tools intended for finishing cuts.

This invention is generally applicable to all members of the material family collectively described as 'carbide', that is the composite material comprising particles of an at least one metal carbide chemical compound dispersed in a metal binder which surrounds and secures the particles. The invention is particularly suitable for those materials where the metallic binder phase is cobalt or nickel since the process conditions identified by this inventor effectively suppress the undesired formation of graphite in these binder materials. This result contrasts with the results of conventional CVD diamond deposition procedures Thus the invention comprises a method for improving the adhesion between a carbide article and a polycrystalline diamond coating applied through a chemical vapor deposition process. The general procedure is to:

Clean the article surface;

Roughen the article surface;

Place the article in a CVD chamber in an atmosphere comprising a specified proportion of hydrocarbon gas and hydrogen gas at a pressure of less than atmospheric pressure and elevated temperature;

Conduct a CVD process to selectively co-deposit polycrystalline diamond on the carbide and carbon nanotubes on the cobalt binder.

As is well known, diamond results when the bonding electrons in carbon-carbon bonds undergo sp3 hybridization, while graphite results from sp2 hybridization. CVD films may be referred to as diamond or diamond-like depending on the relative degrees of sp3 and sp2 hybridization of the carbon-carbon bonds in the film. For convenience only, in the following discussion the coating deposited using CVD will be described as 'diamond' or 'polycrystalline diamond', without regard to the specific bond character.

Some surface preparation is required. First, the surface should be abraded with micron-sized abrasive particles such as silicon carbide or diamond. This preferably will be performed in an abrasive blasting process, which is the operation of cleaning or preparing a surface by forcibly propelling a stream of abrasive material against it. Propulsion of the abrasive is most conveniently achieved by entraining the abrasive in a carrier fluid such as air, nitrogen or argon and directing it under some moderate pressure, typically about 35 psi, against the carbide surface for 5 minutes to 10 minutes. This will effectively remove any particulate debris as it removes any gross contamination and roughens the surface. The tool may then be degreased by ultrasonic cleaning in acetone followed by methanol or ethanol and thoroughly dried.

The mechanically and chemically cleaned tool is then placed in a CVD chamber at an operating temperature of greater than 300° C. After reaching the chamber operating temperature the tool is initially exposed to only hydrogen gas for a period of up to 30 minutes to reduce any remaining surface oxides prior to initiating diamond deposition.

After all oxides are reduced, the gas mixture is modified by adding a gaseous hydrocarbon so that the gas comprises a hydrogen-hydrocarbon mixture. The preferred gaseous hydrocarbons are methane ($CH_4$) or acetylene ($C_2H_2$) but others may also be used including higher alkanes or alkynes, alkenes, cycloalkanes and arenes. The total chamber pressure should be maintained between 5 and 100 torr.

The detailed practice of the invention will be described for the case of methane as the hydrocarbon gas. While similar principles hold when other gaseous hydrocarbons are employed, the specific process window will depend on the choice of hydrocarbon. For example, if acetylene is substituted for methane, the proportion of hydrocarbon gas in the gas mixture or the range of acceptable proportions of hydrocarbon gas in the mixture will shift to require lower acetylene concentrations relative to methane concentrations. Those skilled in the art will recognize that appropriate gas mixtures and processing temperatures for any hydrocarbon feed stock may readily be determined theoretically or through minimal experimentation.

Figure 2:
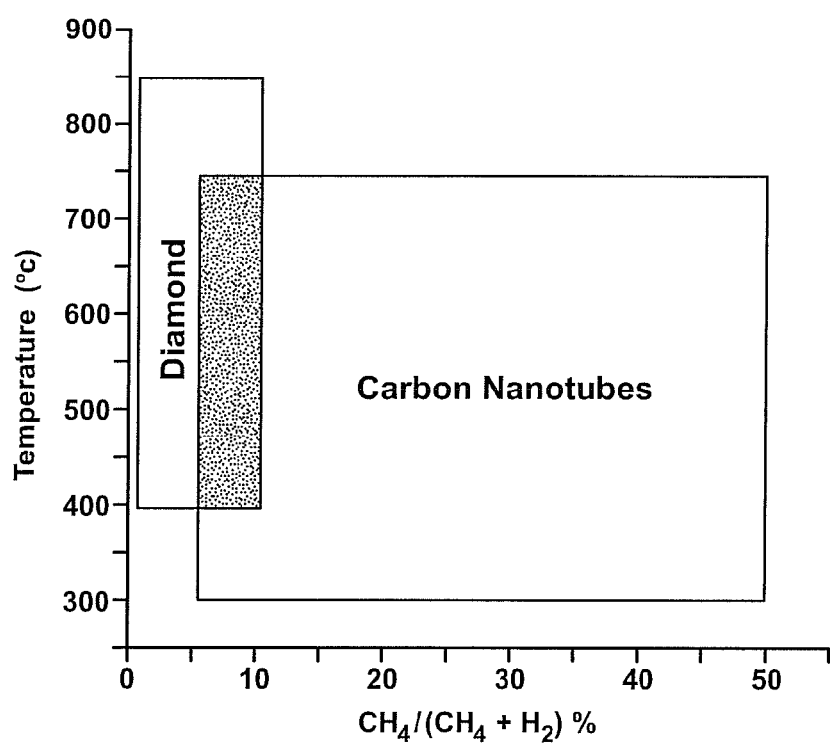
FIG. 2 is a graph showing process parameters developed for a substrate characterized by a specific combination of tungsten carbide particles in a cobalt matrix. The predetermined parameters are the temperature ranges and the fraction of methane gas in a methane/hydrogen gas mixture under which a chemical vapor deposition process will produce diamond or carbon nanotubes.

When the hydrocarbon is methane ($CH_4$), reference to FIG. 2, generated from data taken by the inventor, discloses that at temperatures of between 400° C. and 850° C. with a ($CH_4/(CH_4+H_2)$) ratio of less than 10%, diamond may be deposited (area labeled Diamond in FIG. 2), although higher growth temperatures are known to be preferred since they yield higher quality diamond. At temperatures between 300° C. and 750° C. and a ($CH_4/(CH_4+H_2)$) ratio ranging from 5 to 50% carbon nanotubes may be formed (area labeled Carbon Nanotubes in FIG. 2). These processes proceed by a nucleation and growth mechanism and the nucleation sites are specific to, and catalyzed by, the substrate.

Figure 3A:
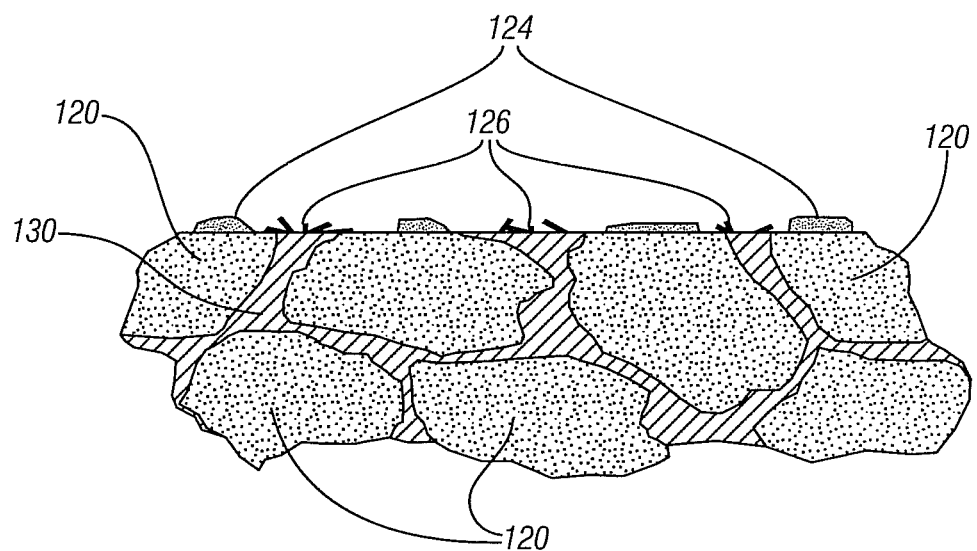
FIGS. 3A and 3B present schematic representations of a diamond- and carbon nanotube-containing wear-resistant coating produced by practice of this invention.

As schematically shown in FIG. 3A, during the early stages of deposition the tungsten carbide particles 120 catalyze nucleation of diamond deposits 124, here shown as discrete 'islands' on their associated carbide particle 120, and the cobalt binder phase 130 catalyzes nucleation of carbon nanotubes 126. Once nucleated, growth proceeds by the deposition of additional carbon atoms on the two carbon-based entities promoting: lateral spreading and merging of the diamond islands to form a now continuous polycrystalline diamond layer 140 (referring now to FIG. 3B); extension and elongation of the carbon nanotubes 126; and a resultant intergrowth and intermingling of the original individual polycrystalline diamond deposits 124 (FIG. 3A).

Although not relied upon, it is believed that the process of mechanically cleaning the surface through abrasive particles entrained in a gas flow is effective in generating small asperities in the ductile binder phase and that these asperities act as nucleation sites for carbon nanotubes.

Figure 3B:
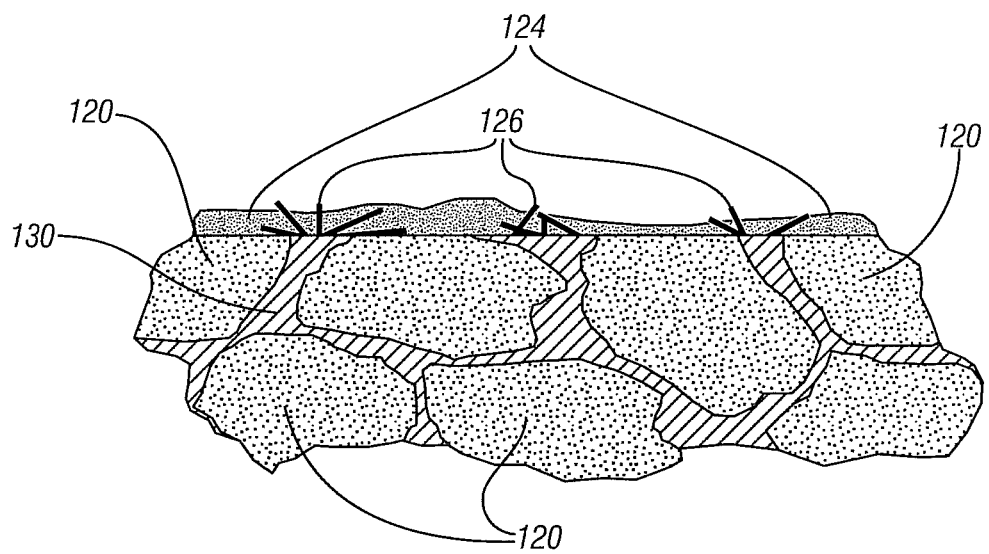

Hence there is a process window of between 400° C. and 750° C. and a ($CH_4/(CH_4+H_2)$) ratio of between 5% and 10% where both carbide catalyzed diamond and cobalt-catalyzed carbon nanotubes may be deposited simultaneously. This is the region where Diamond and Carbon Nanotube favorable deposition parameters overlap as illustrated in FIG. 2. Due to the selective catalytic activity of the carbide and the cobalt the nucleation sites for these deposits will be spatially separated. However with continued growth, the diamond and the carbon nanotubes will grow together and intermingle so that the resulting polycrystalline diamond coating may be reinforced by the carbon nanotubes as schematically indicated in FIG. 3B.

The deposits of carbon nanotubes generated within this restricted process window contribute to the overall coating adhesion and hardness of the diamond coating in two ways. First, they enhance coating adhesion indirectly by suppressing graphite formation which tends to form readily on cobalt and is very deleterious to coating adhesion. The carbon nanotubes, which are extremely strong and stiff in a direction along their length, act as fiber reinforcements for the diamond coating. Since the nanotubes are well adhered to the cobalt, the nanotube fibers are very effective in imparting fiber reinforcement to the diamond-carbon nanotube composite, improving both its fracture toughness and adhesion.

The deposition process may be conducted using either of plasma or hot filament deposition processes but plasma would be preferred, since the gas species would have higher activities.

The process may be carried out over a period of 4-10 hours at the discretion of the operator, and may be varied based on the desired coating thickness, generally up to 30 micrometers, and the desired degree of intergrowth of the nanotubes and polycrystalline diamond.

While the specific fracture toughness of carbon nanotube reinforced polycrystalline diamond is not known, it is known that a number of ceramics which have been toughened by continuous fiber reinforcement exhibit fracture toughnesses in the range of 16-30 MPa$\sqrt{m}$. Assuming comparable results in this case, the practice of this invention is expected to yield an improvement in fracture toughness of at least a factor of two and significantly improve the performance of diamond-coated carbide tools.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The invention claimed is:

1. A method for depositing an adherent diamond-containing coating on a substrate consisting of metal carbide particles in a metallic binder, the method comprising:

contacting the substrate consisting of metal carbide particles in a metallic binder with a gaseous mixture comprising a hydrocarbon and hydrogen under conditions enabling simultaneous deposition of carbon nanotubes and polycrystalline diamond from the gaseous mixture onto the metal carbide particles and metallic binder of the substrate, the deposited coating comprising a layer of polycrystalline diamond containing carbon nanotubes.

2. The method of claim 1 wherein the gaseous hydrocarbon consists essentially of one or more hydrocarbon compounds selected from the group consisting of alkanes, alkenes, alkynes, cycloalkanes and arenes.

3. The method of claim 1 wherein the metal carbide particles comprise tungsten carbide and the metallic binder is selected from the group consisting of cobalt, nickel, and chromium, and alloys thereof.

4. The method of claim 1 wherein the hydrocarbon gas is methane and wherein the conditions enabling simultaneous deposition of carbon nanotubes on cobalt and diamond on the metallic carbide particles comprise;
   a temperature in the range of 400° C. to 750° C.;
   a total gas pressure of between 10 and 100 torr; and
   a gaseous mixture comprising 5% to 10% by volume of methane.

5. The method of claim 1 wherein the substrate is one of the group consisting of cutting tools, bushings, drill bushings, seal rings, nozzles, dies, guides, rollers, wear strips, punches and pins.

6. A method for depositing an adherent polycrystalline diamond-containing coating on a tool substrate consisting of metal carbide particles in a metallic cobalt binder, the metallic carbide particles and cobalt both being exposed at the substrate surface; the method comprising:

selecting a tool substrate composition and a combination of hydrogen and at least one hydrocarbon compound as a potential gaseous mixture for deposition of carbon on the substrate;

predetermining hydrocarbon compound and hydrogen gaseous mixtures for the selected substrate and temperature and pressure parameters for contacting the tool substrate with the gaseous mixtures to co-deposit on the substrate surface a coating layer consisting essentially of a polycrystalline diamond matrix containing carbon nanotubes; and thereafter depositing such coating layer on the substrate using the predetermined gaseous mixtures and parameters.

7. The method of claim 6 wherein the gaseous hydrocarbon is at least one of the group consisting of alkanes, alkenes, alkynes, cycloalkanes and arenes.

8. The method of claim 6 wherein the metallic carbide particles comprise tungsten carbide.

9. The method of claim 6 wherein the hydrocarbon gas is methane and wherein the predetermined parameters enable simultaneous deposition of carbon nanotubes on cobalt and diamond on the metallic carbide particles comprise;
   a temperature in the range of 400° C. to 750° C.;
   a total gas pressure of between 10 and 100 torr; and
   a gaseous mixture comprising 5% to 10% by volume of methane.

* * * * *